(12) United States Patent
Yu et al.

(10) Patent No.: US 9,659,768 B2
(45) Date of Patent: May 23, 2017

(54) FOCUSED RADIATION BEAM INDUCED THIN FILM DEPOSITION

(71) Applicant: Taiwan Semiconductor Manufacturing Company, Ltd., Hisn-Chu (TW)

(72) Inventors: Chia-Hao Yu, Hsin-Chu (TW); Yuan-Chih Chu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 158 days.

(21) Appl. No.: 14/580,463

(22) Filed: Dec. 23, 2014

(65) Prior Publication Data

US 2016/0181094 A1    Jun. 23, 2016

(51) Int. Cl.
*H01L 21/44* (2006.01)
*H01L 21/02* (2006.01)
*C23C 16/04* (2006.01)

(52) U.S. Cl.
CPC ...... *H01L 21/02277* (2013.01); *C23C 16/047* (2013.01); *H01L 21/0262* (2013.01); *H01L 21/02521* (2013.01)

(58) Field of Classification Search
CPC ........... H01L 21/0262; H01L 21/02277; H01L 21/28556
See application file for complete search history.

(56) References Cited

U.S. PATENT DOCUMENTS

| | | |
|---|---|---|
| 5,114,559 A | 5/1992 | Ohta et al. |
| 8,464,186 B2 | 6/2013 | Wang et al. |
| 8,468,473 B1 | 6/2013 | Wang et al. |
| 8,473,877 B2 | 6/2013 | Wang et al. |
| 8,507,159 B2 | 8/2013 | Wang et al. |
| 8,510,687 B1 | 8/2013 | Liu et al. |
| 8,524,427 B2 | 9/2013 | Shin et al. |
| 8,530,121 B2 | 9/2013 | Wang et al. |
| 8,563,224 B1 | 10/2013 | Chen et al. |
| 8,584,057 B2 | 11/2013 | Liu et al. |
| 8,601,407 B2 | 12/2013 | Wang et al. |
| 8,609,308 B1 | 12/2013 | Chen et al. |
| 8,627,241 B2 | 1/2014 | Wang et al. |

(Continued)

OTHER PUBLICATIONS

James Bishop et al., "Effects of Oxygen on Electron Beam Induced Deposition of SiO2 using Physisorbed and Chemisorbed Tetraethoxysilane," AIP Journal of Applied Physics, AIP Applied Physics Letters 101, 211605 (2012) Nov. 2012, pp. 211605-1 through 211605-3.

(Continued)

*Primary Examiner* — Trung Q Dang
(74) *Attorney, Agent, or Firm* — Haynes and Boone, LLP

(57) ABSTRACT

A method of depositing a material on a surface is disclosed. The method includes focusing a radiation beam on the surface and introducing a precursor gas near the surface wherein the precursor gas forms the material on the surface upon radiation by the radiation beam. The method further includes introducing an assistant gas near the surface wherein the assistant gas produces nitric oxide radicals upon radiation by the radiation beam. The nitric oxide radicals facilitate the dissociation process of the precursor gas and reduce contaminants in the deposited material.

20 Claims, 7 Drawing Sheets

(56) References Cited

U.S. PATENT DOCUMENTS

| | | | |
|---|---|---|---|
| 8,677,511 B2 | 3/2014 | Wang et al. | |
| 8,762,900 B2 | 6/2014 | Shin et al. | |
| 8,822,106 B2 | 9/2014 | Wang et al. | |
| 8,828,632 B2 | 9/2014 | Wang et al. | |
| 8,835,082 B2 | 9/2014 | Chen et al. | |
| 8,841,049 B2 | 9/2014 | Wang et al. | |
| 8,846,278 B2 | 9/2014 | Shin et al. | |
| 2010/0282596 A1* | 11/2010 | Auth | C23F 4/00 204/157.46 |
| 2011/0031394 A1* | 2/2011 | Knowles | H01J 37/301 250/307 |
| 2014/0273514 A1* | 9/2014 | Somervell | C23C 14/221 438/763 |

OTHER PUBLICATIONS

U.S. Appl. No. 14/019,809, filed Sep. 6, 2013, by inventors Chia-Hao Yu and Ming-Yun Chen for "Method of Manufacturing an Extreme Ultraviolet (EUV) Mask and the Mask Manufactured Therefrom," 17 pages of text, 12 pages of drawings.

* cited by examiner

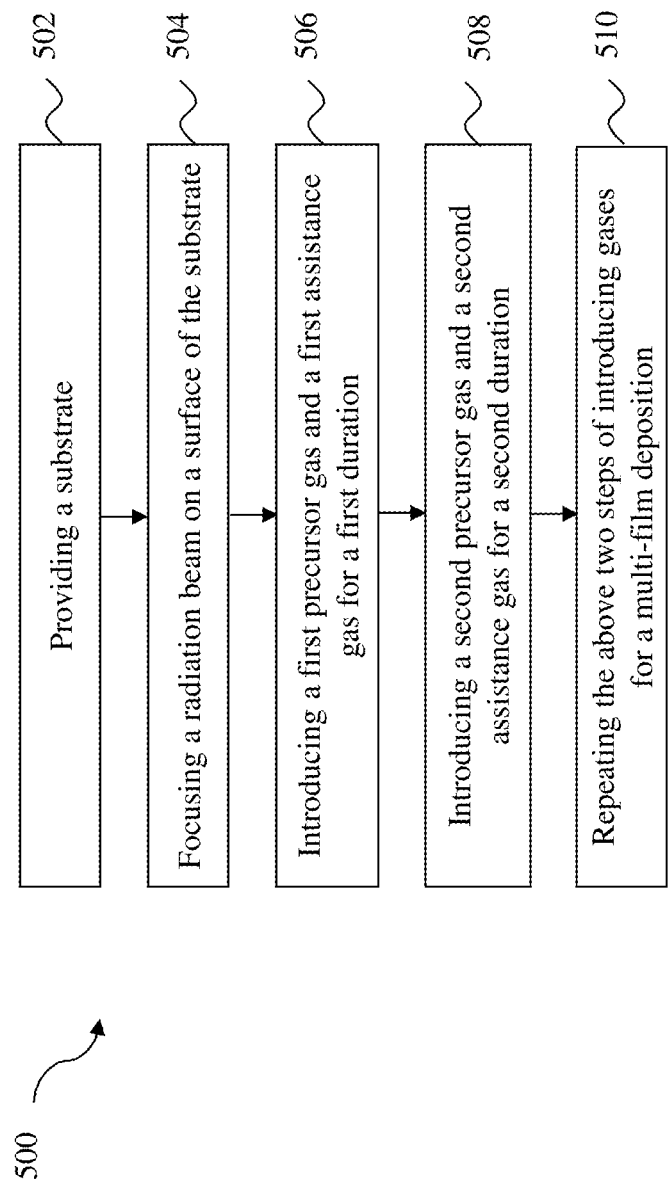

FOCUSED RADIATION BEAM INDUCED THIN FILM DEPOSITION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, focused ion beam or focused electron beam induced deposition has been used for thin film deposition. In such a method, a precursor gas is introduced near a substrate held in a sealed chamber and a focused ion or electron beam causes the precursor gas to undergo molecular dissociation. Dissociated molecules adsorb onto the surface of the substrate, forming a thin film thereon. Film impurity and low deposition throughput have been two main disadvantages associated with these techniques. When focused ion or electron beam is used for forming multiple thin films, further issues arise whereby a thin film formed from one precursor gas is contaminated by another precursor gas used for forming another thin film. Such contamination results in degradation of finally deposited thin films, and therefore should be avoided.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5 illustrates a flow chart of a deposition method according to various aspects of the present disclosure.

DETAILED DESCRIPTION

Figure 1:
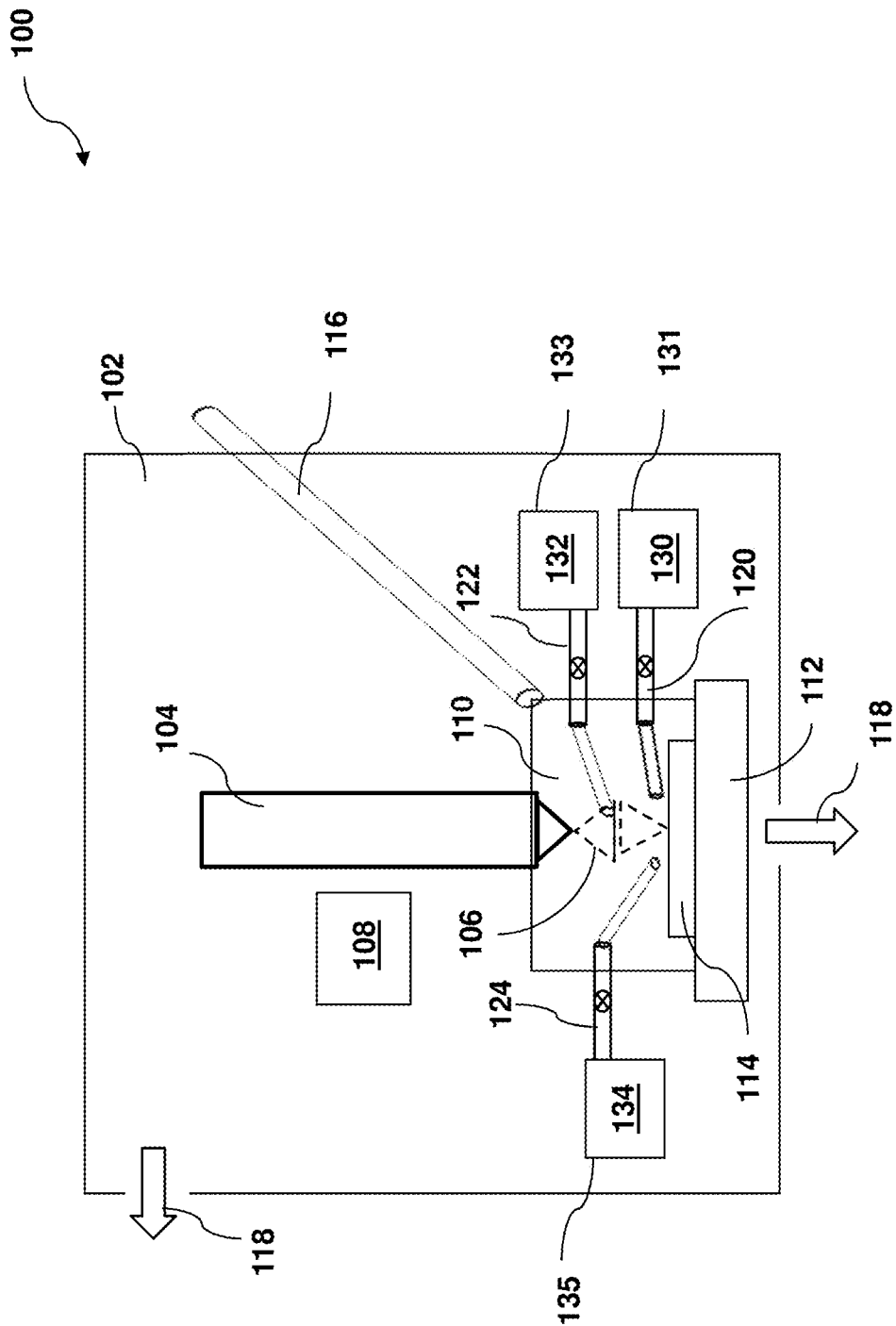
FIG. 1 illustrates a focused electron beam deposition system according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to film deposition techniques, and more particularly, to techniques for single film and/or multi-film deposition induced by a focused incident radiation beam, such as an ion beam, a laser beam, or an electron beam. In the following discussion, such deposition techniques are collectively referred to as focused beam induced deposition (FBID). FBID can be used for forming thin films with thickness accuracy down to nanometers or smaller. This is advantageous over other deposition techniques as the semiconductor process continues to scale down. However, FBID has two main disadvantages. One disadvantage is the low purity of the deposited films. The other disadvantage is the low throughput inherent to the serial beam write process. Both disadvantages become more problematic in multi-film deposition using FBID techniques. In multi-film deposition, two or more precursor gases are pumped in and out of the deposition chamber in an alternating manner with each precursor gas being used for depositing one film. Due to various factors, such as limited pumping efficiency of the system or limited conversion efficiency of the precursor gases, some of the precursor gases accumulate in the chamber and become contaminants for subsequently deposited films. This undoubtedly exacerbates the impurity of the deposited films. This also reduces the throughput of the deposition system as the accumulated precursor gases prevent the later introduced gases from being fully converted by the focused radiation beam. The present disclosure provides apparatuses and methods for addressing the above problems. Embodiments of the present disclosure provide a low cost solution to existing FBID deposition systems by introducing a functional assistant gas during at least one stage of the multi-film deposition process. The functional assistant gas not only increases the conversion rate of the precursor gases but also removes residual by-products in the deposition chamber.

As will be demonstrated, embodiments of the present disclosure may benefit various semiconductor manufacturing processes including, but not limited to, integrated circuit (IC) fabrication, mask fabrication, and mask repair. In the following discussion, thin films of a first material and thin films of a second material are deposited on a substrate in an alternating manner, illustrating various aspects of the present disclosure. In various embodiments, the deposited thin films can be of different materials and with different thickness. For example, thin films of the following materials can be advantageously deposited with embodiments of the present disclosure: Al, Au, C, Co, Cr, Cu, Fe, GaAs, GaN, Mo, Ni, Os, Pd, Pt, Rh, Ru, Re, Si, $Si_3N_4$, SiOx (e.g., SiO2), TiOx (e.g., TiO2), and W.

FIG. 1 shows a simplified diagrammatic view of an FBID system 100. In the embodiment as shown, the FBID system 100 includes a vacuum chamber 102 which houses various components of the FBID system 100; a beam generator 104 that is configured to generate an energetic and focused radiation beam 106; a variable pressure sub-chamber 110; and a stage 112 that is configured to hold a target 114 inside the sub-chamber 110. The FBID system 100 further includes gas inlets 120, 122, and 124 that are configured to introduce (or inject) various gases 130, 132, and 134 from respective reservoirs 131, 133, and 135 into the sub-chamber 110. The FBID system 100 further includes a control module 108, a secondary electron detector 116, and a pump system 118. In an embodiment, the control module 108 is coupled to a computer system (not shown) for controlling the movement of the focused radiation beam 106 relative to the target 114. For example, the radiation beam 106 may scan certain areas of the target 114 so that thin films are deposited with predefined dimensions. The secondary electron detector 116 detects and images secondary electrons in the sub-chamber 110. The pump system 118 maintains the chamber 102 in high vacuum.

In an embodiment, the beam generator 104 includes a focused ion beam gun. For example, positively or negatively charged ions can be generated from a gas, such as hydrogen, helium, carbon, nitrogen, oxygen, neon, argon, krypton, and xenon. In another embodiment, the beam generator 104 includes a focused electron beam gun. For example, electrons can be generated from a conducting material by heating the conducting material to a very high temperature, whereby the electrons have sufficient energy to overcome a work function barrier and escape from the conducting material (thermionic sources). Electrons can also be generated by applying an electric field sufficiently strong such that electrons tunnel through the work function barrier of a conducting material (field emission sources). The beam generator 104 further includes various components for condensing, magnifying, and/or directing the radiation beam 106. For example, the various components may include condenser lenses, projection aperture, scan coils, objective lenses, and so on. In an example, the beam generator 104 is a tungsten hairpin filament source XL30 environmental scanning electron microscope (ESEM) from the FEI Company at Hillsboro, Oreg., which may generate an electron beam having energy ranging from 10 to 300 keV. The focused radiation beam 106 is directed onto a surface of the target 114.

The target 114 may be substrate, such as a wafer substrate, a mask substrate, or any other suitable substrate. In an embodiment, the target 114 is a mask substrate that includes a low thermal expansion material (LTEM) such as fused silica, fused quartz, calcium fluoride ($CaF_2$), silicon carbide, silicon oxide-titanium oxide alloy and/or other suitable LTEM. To further this embodiment, the target 114 may be a mask substrate for making a deep ultraviolet (DUV) mask, an extreme ultraviolet (EUV) mask, or other types of masks. In another embodiment, the target 114 includes a silicon wafer. Alternatively or additionally, the target 114 may include another elementary semiconductor, such as germanium; a compound semiconductor; an alloy semiconductor or a semiconductor on insulator (SOI).

In an embodiment, the stage 112 is comprised of a plurality of motors, roller guides, and tables. It secures the target 114 thereon and provides accurate position and movement of the target 114 relative to the radiation beam 106. The target 114 may be secured by vacuum, e-chucking, or other suitable methods.

Figure 2:
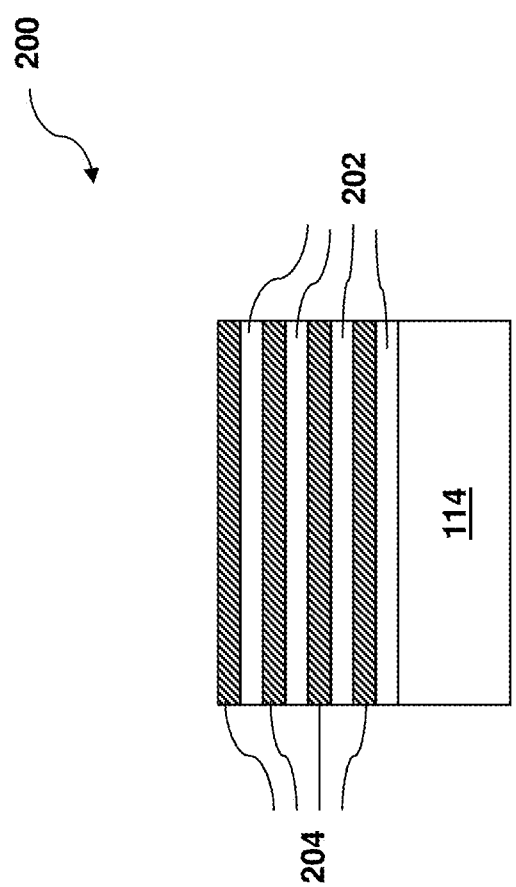
FIG. 2 illustrates a device with multiple films deposited according to various embodiments of the present disclosure.

In an embodiment, each of the gases 130 and 132 is a precursor gas or a mixture of precursor and carrier gases for depositing a thin film over the target 114 to form a device 200 as illustrated in FIG. 2. For example, the gas 130 may be suitable for depositing a metal film, such as Al, Au, Co, Cr, Cu, Fe, Mo, Ni, Os, Pd, Pt, Rh, Ru, Re, or W; and the gas 132 may be suitable for depositing a dielectric film or a semiconductor compound film, such as GaAs, GaN, Si, $Si_3N_4$, SiOx (e.g., SiO2), or TiOx (e.g., TiO2). The exact arrangement of the two films, such as film thickness and the order of the films, may vary depending on applications. In various embodiments, each of the precursor gases 130 and 132 may be selected from the group consisting of: $Al(CH_3)_3$, Phenanthrene $(C_{14}H_{10})$, $Co_2(CO)_8$, $Cr(C_6H_6)_2$, $Cr(CO)_6$, $Fe(CO)_5$, $Mo(CO)_6$, $Ni(CO)_4$, $Os_3(CO)_{12}$, Palladium acetate $(Pd(OOCCH_3)_2)$, $Ru_3(CO)_{12}$, $Re_2(CO)_{10}$, TEOS, $Ti(OC_3H_7)_4$, and $W(CO)_6$. For the sake of convenience, in the present example, films 202 are deposited with the gas 130 and films 204 are deposited with the gas 132.

In one example, to form the films 202 and 204 (FIG. 2), the gases 130 and 132 are individually introduced into the sub-chamber 110 near a surface of the target 114 onto which the radiation beam 106 is focused. The radiation beam 106 induces decomposition of the gas molecules, thereby depositing materials on the surface. A mechanism of the induced deposition is believed to be as follows. The radiation beam 106 (e.g., an electron beam) has very high energy (such as between 10 and 300 keV). Such high energy causes any material near the deposition spot to absorb primary electrons and re-emit secondary electrons having a wide spectrum of energies (of the order 1 keV) and angles. Such secondary electrons cause dissociation of the precursor gas molecules, resulting in a solid deposit on the surface of the target 114 and volatile by-products.

Figure 3A:
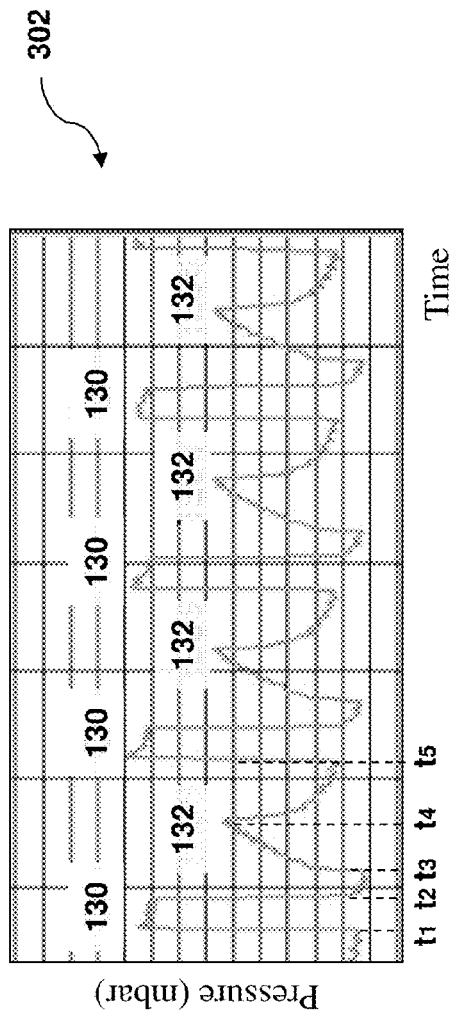
FIGS. 3A and 3B illustrate gas pressures inside a deposition chamber as a function of time during multi-film deposition.
Figure 4A:
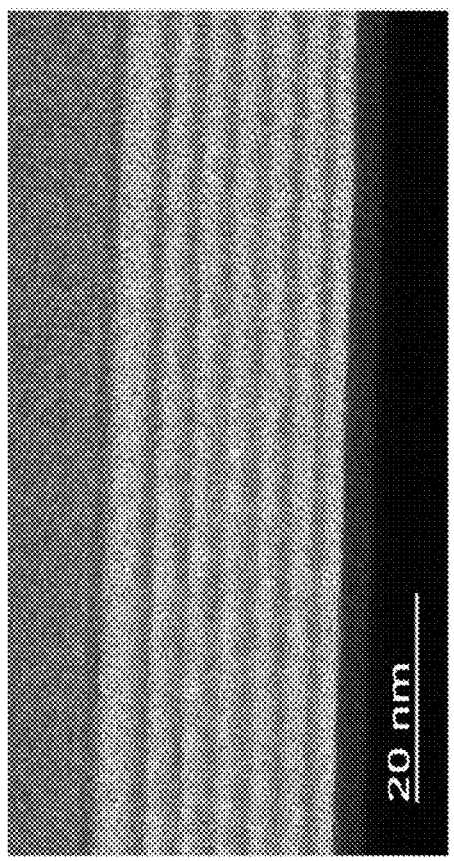
FIGS. 4A and 4B are images of multi-film deposition.

The precursor gases 130 and 132 may be injected into the sub-chamber 110 at a controlled flow rate. In an embodiment, the flow rates of the precursor gases 130 and 132 are regulated by controlling the temperature of the reservoirs 131 and 133 respectively. In addition, the precursor gases 130 and 132 are separately injected into the sub-chamber 110. Mixing the two precursor gases in the sub-chamber 110 leads to contamination of the films thereby formed. Therefore, it is ideal that the sub-chamber 110 is absent of one precursor gas when the other precursor gas is introduced. However, this is not always the case in reality, as illustrated in FIG. 3A. Referring to FIG. 3A, shown therein is a pressure curve 302 of the precursor gases 130 and 132 inside the sub-chamber 110. The pressure curve 302 corresponds to the injection of the two precursor gases 130 and 132 in an alternating manner to form the films 202 and 204 (FIG. 2). For example, at time "$t_1$," the gas inlet 120 (FIG. 1) is turned on and the precursor gas 130 is injected into the sub-chamber 110. After a first duration, such as determined by a desired 202 film thickness, the gas inlet 120 is turned off at time "$t_2$." Shortly thereafter, the curve 302 shows that the pressure of the precursor gas 130 inside the sub-chamber 110 reaches a low level, almost the same as the pressure level prior to the injection, indicating that the precursor gas 130 has been almost fully decomposed by the focused radiation beam 106. At time "$t_3$," the gas inlet 122 is turned on and the precursor gas 132 is injected into the sub-chamber 110. After a second duration, such as determined by a desired 204 film thickness, the gas inlet 122 is turned off at time "$t_4$." However, compared with the injection of the precursor gas 130, it takes much longer for the precursor gas 132 both to reach its pressure peak after the gas inlet 122 is turned on and to deplete after the gas inlet 122 is turned off. As shown in FIG. 3A, both the rising and falling pressure curves of the precursor gas 132 appear to be exponential in time, indicating a low deposition throughput which is undesirable. Another observation is that when the gas inlet 120 is again turned on at time "$t_5$," there are residual precursor gas 132 and associated by-products in the sub-chamber 110. This leads to contamination of the 202 films and blurry interfaces between adjacent 202/204 films, as shown in FIG. 4A. Such film impurity is highly undesirable because it degrades the final function of the deposited films. In some instances, a pump (not shown) may be employed to help remove some of the residual gases from the sub-chamber 110. In various embodiments, the present disclosure provides a low-cost, yet very effective approach for improving both film purity and deposition throughput.

In the present embodiment as shown in FIG. 1, the gas inlet 124 is configured to inject the gas 134 into the sub-chamber 110 during some or all stages of the multi-film deposition. The gas 134 is an assistant gas, i.e., it assists the decomposition of the precursor gases 130 and/or 132 during the deposition. In this regard, the assistant gas 134 has several properties. For example, it has low dissociation energy, such as less than 50 eV, and can be easily dissociated under the focused radiation beam 106. The dissociated atoms of the assistant gas 134 can quickly react with the precursor gases 130 or 132 to break the chemical bonds thereof, producing highly reactive free radicals. The dissociated atoms of the gas 134 can also help lower contaminants in the deposited films by forming volatile by-products. In an embodiment, the assistant gas 134 is a nitrogen oxide such as nitrogen dioxide ($NO_2$), nitrous oxide ($N_2O$), nitrosylazide ($N_4O$), nitrate radical ($NO_3$), dinitrogen trioxide ($N_2O_3$), dinitrogen tetroxide ($N_2O_4$), dinitrogen pentoxide ($N_2O_5$), and trinitramide ($N(NO_2)_3$). To further this embodiment, the nitrogen oxide molecules, once dissociated, produce highly active free radicals NO* and O*. The free radicals NO* promote the dissociation of precursor gas molecules as well as the removal of the dissociated by-products by linking up with them to form evaporable products, thereby improving purity of the deposited films. In another embodiment, the assistant gas 134 is water vapor ($H_2O$), ozone ($O_3$), or a mixture thereof. In some embodiments, the assistant gas 134 is a polarized gas. Polarized gas molecules may adsorb to the surface of the target 114 longer than neutral gas molecules, thereby providing higher conversion efficiency. In various embodiments, the assistant gas 134 may benefit the deposition of film(s) where the precursor gas contains one or more of the following groups: (CO), (CH), and (OCH).

Figure 3B:
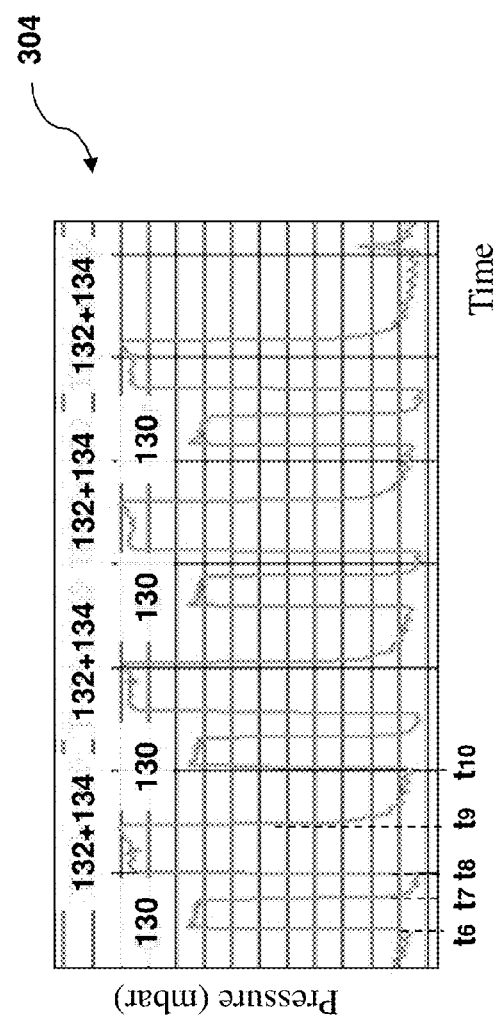
Figure 4B:
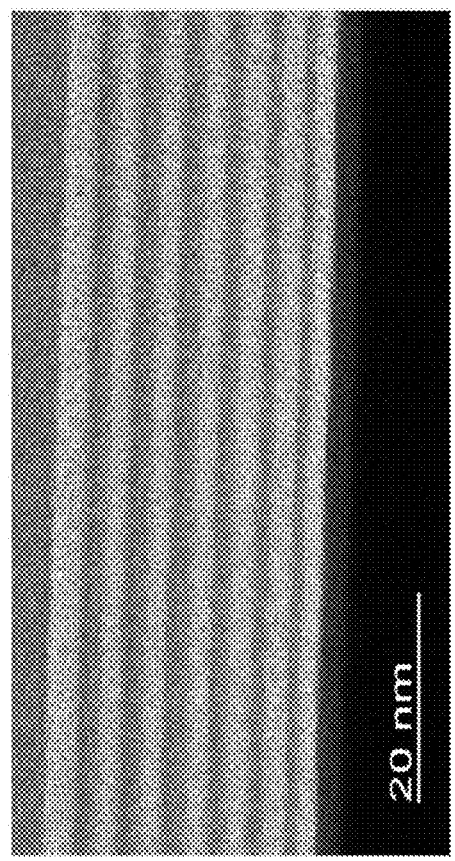

In various embodiments, the assistant gas 134 may be injected into the sub-chamber 110, co-existent with the precursor gas 130 and/or the precursor gas 132. FIG. 3B illustrates a pressure curve 304 of the precursor gases 130 and 132 inside the sub-chamber 110 whereby the precursor gas 132 is injected simultaneously with the assistant gas 134. Referring to FIG. 3B, the gas inlet 120 is turned on at time "$t_6$" and turned off at time "$t_7$," in manners similar to what have been discussed with respect to FIG. 3A. At time "$t_8$," both the gas inlets 122 and 124 are turned on and the precursor gas 132 and the assistant gas 134 are injected into the sub-chamber 110. At time "$t_9$," both the gas inlets 122 and 124 are turned off. The pressure curve 304 shows that the pressure of the precursor gas 132 inside the sub-chamber 110 reaches a low level almost the same as the one prior to the injection of the precursor gas 132, indicating that the precursor gas 132 has been almost fully decomposed by the focused radiation beam 106. When the gas inlet 120 is again turned on at time "$t_{10}$," the sub-chamber 110 is substantially free of the precursor gas 132. Therefore, the films 202/204 thus deposited achieve high purity in each of the films and have clear boundaries between adjacent films, as shown in FIG. 4B. A further observation is that the precursor gas 132 depletes quickly after the gas inlet 122 is turned off at time "$t_9$," indicating a higher deposition throughput than that without the assistant gas 134 (FIG. 3A). During the operations shown in FIG. 3B, a pump (not shown) may be used to beneficially pump out residual gases after each gas inlet is turned off.

Although the benefits of the assistant gas 134 are discussed in the context of multiple alternating film deposition using the FBID system 100, it is not so limited. In various embodiments, the assistant gas 134 can also be used in other deposition methods, in single film deposition, and in deposition with more than two material layers. For example, the assistant gas 134 may be advantageously used in chemical vapor deposition (CVD), plasma enhanced CVD (PECVD), atomic layer deposition (ALD), molecule beam epitaxy (MBE), and sputtering for any deposition process using gas type precursor(s). In addition, the FBID system 100 may employ two or more assistant gases with each one assisting one precursor gas.

FIG. 5 is a flow chart of a method 500 of depositing multiple films on a substrate (e.g., a semiconductor wafer or a mask substrate), according to various aspects of the present disclosure. Additional operations can be provided before, during, and after the method 500, and some operations described can be replaced, eliminated, or moved around for additional embodiments of the method. The method 500 is an example, and is not intended to limit the present disclosure beyond what is explicitly recited in the claims. The method 500 will be described below in conjunction with FIGS. 1, 6A and 6B.

Figure 6A:
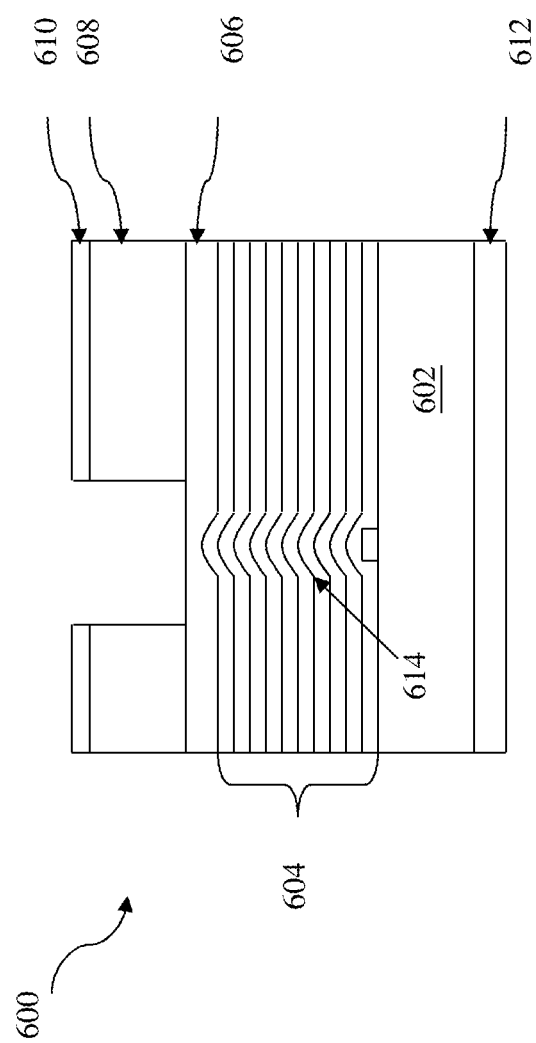
FIGS. 6A and 6B illustrate cross-sectional views of an EUV mask being repaired using the method in FIG. 5, in accordance with an embodiment.

At operation 502, the method 500 is provided with a substrate. In an embodiment, the substrate is the same as the target 114 in FIG. 1. In the present embodiment, the substrate is an EUV mask 600 as shown in FIG. 6A. Referring to FIG. 6A, the EUV mask 600 includes a LTEM mask substrate 602, a reflective multilayer (ML) 604, a buffer layer 606, an absorber layer 608 and a protection layer 610. In addition, a conductive layer 612 may be deposited under the LTEM mask substrate 602 for electrostatic chucking purposes. To further this embodiment, the EUV mask 600 is found to have an EUV phase defect 614 and an embodiment of the method 500 is employed to advantageously form a columnar reflector for locally compensating and repairing the EUV phase defect as disclosed in commonly owned U.S. patent application Ser. No. 14/019809, entitled "Method of Manufacturing an Extreme Ultraviolet (EUV) Mask and the Mask Manufactured Therefrom," the entire disclosure of which is herein incorporated by reference.

The LTEM mask substrate 602 may include fused silica, fused quartz, calcium fluoride ($CaF_2$), silicon carbide, silicon oxide-titanium oxide alloy and/or other suitable LTEM. The ML 604 includes a plurality of film pairs, such as molybdenum-silicon (Mo/Si) film pairs (e.g., a layer of molybdenum above or below a layer of silicon in each film pair). Alternatively, the ML 604 may include molybdenum-beryllium (Mo/Be) film pairs, or any two materials or two material combinations with large difference in refractive indices and small extinction coefficients. In an example, the ML 604 includes 40 pairs of layers of Mo/Si. Each Mo/Si film pair has a thickness of about 7 nanometer (nm), e.g., about 3 nm for Mo and about 4 nm for Si. The capping layer 606 may include ruthenium (Ru) or Ru compounds such as ruthenium-boron (RuB) or ruthenium-silicon (RuSi) and acts as an etching stop layer in a patterning or repairing process of the absorber layer 608. The absorber layer 608 absorbs incident EUV radiations projected thereon. The absorber layer 608 may include a single layer or multiple layers of material selected from the group consisting of chromium (Cr), chromium oxide (CrO), titanium nitride (TiN), tantalum nitride (TaN), tantalum (Ta), titanium (Ti), aluminum-copper (Al—Cu), palladium, tantalum boron nitride (TaBN), aluminum oxide (AlO), molybdenum (Mo), and other suitable materials. The protection layer 610 protects the absorber layer 608 from oxidation when the EUV mask 600 is in a cleaning process. In the EUV mask 600 shown in FIG. 6A, the absorber layer 608 is patterned according to an IC layout. When an incident EUV radiation is projected onto the EUV mask 600, the patterned absorber layer 608 absorbs the EUV radiation while the ML 604 reflects the EUV radiation, thereby forming a patterned EUV radiation. However, the phase defect 614, left uncompensated, distorts the patterned EUV radiation. Using embodiments of the method 500, a columnar reflector can be formed to locally repair the phase defect 614.

In an embodiment, the method 500 is implemented using the FBID system 100 (FIG. 1). To further this embodiment, the EUV mask 600 is secured onto the movable stage 112 in the sub-chamber 110. In the present embodiment, the sub-chamber 110 is maintained at room temperature and its initial pressure is set to about $1 \times 10^{-7}$ mbar.

At operation 504, the method 500 provides an energetic radiation beam, such as the radiation beam 106, and focuses the radiation beam on a surface of the substrate under operation. In the present embodiment, the radiation beam 106 is focused onto a surface of the EUV mask 600 where the phase defect 614 is located. In an embodiment, the radiation beam is a focused ion beam. In another embodiment, the radiation beam is a laser beam. In the present embodiment, the radiation beam is a focused electron beam.

Figure 6B:
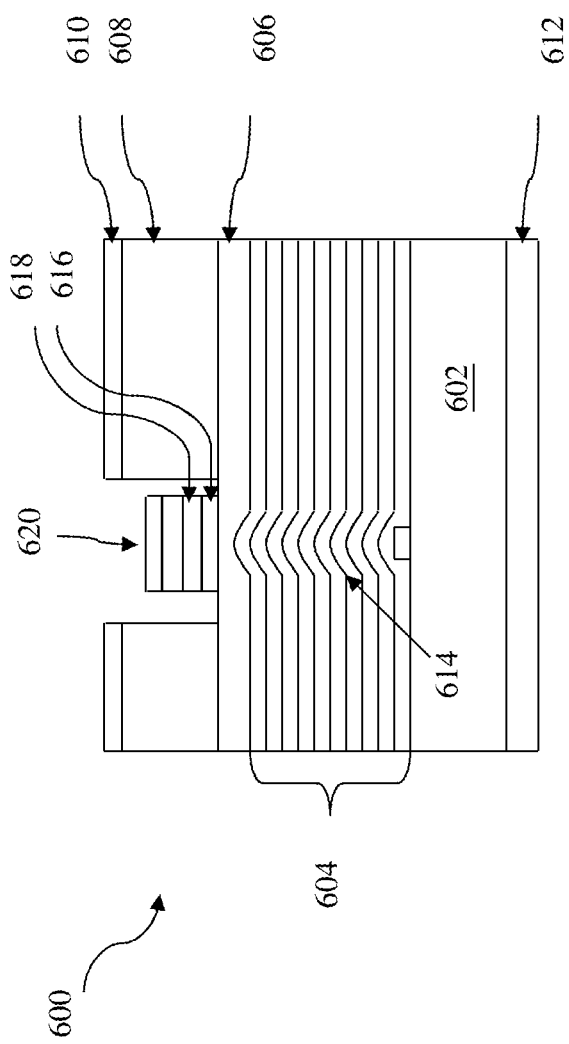

At operation 506, the method 500 introduces a first precursor gas 130 near the surface of the EUV mask 600. Using the FBID system 100, the first precursor gas 130 can be injected into the sub-chamber 110 through the gas inlet 120. The first precursor gas 130 contains a first material to be deposited. When the first precursor gas 130 is radiated by the radiation beam, the precursor gas molecules dissociate, forming a solid material layer 616 on the surface of the EUV mask 600 right above the phase defect 614 (FIG. 6B). The flow rate of the first precursor gas 130 is regulated by controlling the temperature of the reservoir 131 (FIG. 1). In the present embodiment, the temperature of the reservoir 131 is in a range from about −20 degrees Celsius to about 20 degrees Celsius. In an embodiment, the method 500 may further introduce an assistant gas near the surface of the EUV mask 600 where the assistant gas, upon radiation by the radiation beam, produces highly active free radicals NO* and O* for promoting the dissociation of the precursor gas molecules. In embodiments where the first precursor gas 130 can be adequately decomposed and removed from the sub-chamber 110 without an assistant gas, the introduction of the assistant gas becomes optional. In an embodiment, operation 506 is continued for about 30 minutes to about 90 minutes, during which the radiation beam 106 scans the area for depositing one thin film 616. After the film 616 has reached a desired thickness, the injection of the first precursor gas 130 is stopped (e.g., by shutting off the gas inlet 120). In an embodiment, residual gases in the sub-chamber 110 are pumped out.

At operation 508, the method 500 introduces a second precursor gas 132 near the surface of the EUV mask 600. The second precursor gas 132 contains a second material to be deposited in the presence of the radiation beam 106 in forming a thin film 618 over the film 616 (FIG. 6B). In an embodiment, the method 500 further introduces an assistant gas 134 (FIG. 1) near the surface of the EUV mask 600. The assistant gas 134 produces highly active free radicals NO* and O* upon radiation by the radiation beam, thereby promoting the dissociation of the second precursor gas molecules. In various embodiments, the assistant gases introduced in operations 506 and 508 may be the same or different gases. The flow rate of the second precursor gas 132 is regulated by controlling the temperature of the reservoir 133. In the present embodiment, the temperature of the reservoir 133 is in a range from about −20 degrees Celsius to about 20 degrees Celsius. The flow rate of the assistant gas 134 is controlled to be in a range from about 0.6 to about 1.5 standard cubic centimeters per minute (sccm). In an embodiment, operation 508 is continued for about 30 minutes to about 90 minutes, during which the radiation beam 106 scans the area for depositing the film 618 over the film 616. After the film 618 has reached a desired thickness, the injection of the second precursor gas 132 and the assistant gas 134 are stopped (e.g., by shutting off the gas inlets 122 and 124). In the present embodiment, the assistant gas 134 is particularly beneficial to the 616/618 film deposition and helps maintain the sub-chamber 110 substantially free of contaminants. In an embodiment, residual gases in the sub-chamber 110 are pumped out.

At operation 510, the method 500 repeats the steps performed in the operations 506 and 508 until a plurality of thin 616/618 films are deposited in an alternating fashion, forming a columnar reflector 620 as shown in FIG. 6B.

Although not intended to be limiting, one or more embodiments of the present disclosure provide many benefits to film deposition. For example, embodiments of the present disclosure provide low-cost solutions to FBID systems for improving precursor gas conversion efficiency and for improving purity in deposited films. Also, embodiments of the present disclosure can be applied to a variety of precursor gases for depositing various materials.

In one exemplary aspect, the present disclosure is directed to a method of depositing a material on a surface. The method includes focusing a radiation beam on the surface and introducing a precursor gas near the surface wherein the precursor gas forms the material on the surface upon radiation by the radiation beam. The method further includes introducing an assistant gas near the surface wherein the assistant gas produces nitric oxide radicals upon radiation by the radiation beam.

In another exemplary aspect, the present disclosure is directed to a deposition method. The method includes providing a substrate and focusing a radiation beam on a surface of the substrate. The method further includes introducing an assistant gas near the surface wherein the assistant gas is a nitrogen oxide. The method further includes introducing a first precursor gas near the surface for a first duration wherein the first precursor gas, upon radiation by the radiation beam, forms a first film on the surface.

In another exemplary aspect, the present disclosure is directed to a method of forming a device. The method includes focusing a radiation beam on a surface of a substrate held in a chamber and injecting an assistant gas into the chamber wherein the assistant gas produces nitric oxide radicals upon radiation by the radiation beam. The method further includes injecting a first precursor gas into the chamber wherein the first precursor gas, upon radiation by the radiation beam, forms a first film on the surface. The method further includes stopping the injection of the assistant gas and the first precursor gas after the first film reaches a first thickness.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
focusing a radiation beam on a surface;
introducing a precursor gas near the surface wherein the precursor gas forms a first material on the surface upon radiation by the radiation beam;
introducing an assistant gas near the surface wherein the assistant gas produces nitric oxide radicals upon radiation by the radiation beam; and
introducing another precursor gas near the surface wherein the second precursor gas forms a second material over the first material upon radiation by the radiation beam.

2. The method of claim 1, wherein the assistant gas produces oxygen radicals upon radiation by the radiation beam.

3. The method of claim 1, wherein the assistant gas is selected from the group consisting of: nitrogen dioxide ($NO_2$), nitrous oxide ($N_2O$), nitrosylazide ($N_4O$), nitrate radical ($NO_3$), dinitrogen trioxide ($N_2O_3$), dinitrogen tetroxide ($N_2O_4$), dinitrogen pentoxide ($N_2O_5$), and trinitramide ($N(NO_2)_3$).

4. The method of claim 1, wherein the assistant gas is a polarized gas.

5. The method of claim 1, wherein the precursor gas is selected from the group consisting of: $Al(CH_3)_3$, $Cl_4H_{10}$, $Co_2(CO)_8$, $Cr(C_6H_6)_2$, $Cr(CO)_6$, $Fe(CO)_5$, $Mo(CO)_6$, $Ni(CO)_4$, $Os_3(CO)_{12}$, $Pd(OOCCH_3)_2$, $Ru_3(CO)_{12}$, $Re_2(CO)_{10}$, TEOS, $Ti(-OC_3H_7)_4$, and $W(CO)_6$.

6. The method of claim 1, wherein the radiation beam is an electron beam.

7. The method of claim 1, wherein the radiation beam is an ion beam.

8. A method comprising:
providing a substrate;
focusing a radiation beam on a surface of the substrate;
introducing an assistant gas near the surface wherein the assistant gas is a nitrogen oxide;
introducing a first precursor gas near the surface for a first duration wherein the first precursor gas, upon radiation by the radiation beam, forms a first film on the surface; and
introducing a second precursor gas near the surface for a second duration wherein the second precursor gas, upon radiation by the radiation beam, forms a second film over the first film.

9. The method of claim 8, wherein the assistant gas is selected from the group consisting of: nitrogen dioxide ($NO_2$), nitrous oxide ($N_2O$), nitrosylazide ($N_4O$), nitrate radical ($NO_3$), dinitrogen trioxide ($N_2O_3$), dinitrogen tetroxide ($N_2O_4$), dinitrogen pentoxide ($N_2O_5$), and trinitramide ($N(NO_2)_3$).

10. The method of claim 8, wherein the assistant gas is a polarized gas.

11. The method of claim 8, further comprising:
repeating the steps of introducing the first precursor gas and introducing the second precursor gas until a plurality of first and second films are formed in an alternating manner.

12. The method of claim 8, wherein:
the first and second precursor gases are each selected from the group consisting of: $Al(CH_3)_3$, $Cl_4H_{10}$, $Co_2(CO)_8$, $Cr(C_6H_6)_2$, $Cr(CO)_6$, $Fe(CO)_5$, $Mo(CO)_6$, $Ni(CO)_4$, $Os_3(CO)_{12}$, $Pd(OOCCH_3)_2$, $Ru_3(CO)_{12}$, $Re_2(CO)_{10}$, TEOS, $Ti(-OC_3H_7)_4$, and $W(CO)_6$; and
the first and second precursor gases are different.

13. The method of claim 8, wherein the radiation beam is an electron beam.

14. A method of forming a device, comprising:
focusing a radiation beam on a surface of a substrate held in a chamber;
injecting an assistant gas into the chamber wherein the assistant gas produces nitric oxide radicals upon radiation by the radiation beam;
injecting a first precursor gas into the chamber wherein the first precursor gas, upon radiation by the radiation beam, forms a first film on the surface;
stopping the injection of the assistant gas and the first precursor gas after the first film reaches a first thickness;
injecting a second precursor gas into the chamber wherein the second precursor gas, upon radiation by the radiation beam, forms a second film over the first film; and
stopping the injection of the second precursor gas after the second film reaches a second thickness.

15. The method of claim 14, further comprising:
pumping gases out of the chamber after the stopping of the injection of the assistant gas and the first precursor gas.

16. The method of claim 14, further comprising:
injecting the assistant gas into the chamber during the injection of the second precursor gas.

17. The method of claim 14, further comprising:
forming a plurality of films in an alternating manner by repeating the steps of injecting the assistant gas, injecting the first precursor gas, stopping the injection of the assistant gas and the first precursor gas, injecting the second precursor gas, and stopping the injection of the second precursor gas.

18. The method of claim 14, wherein the substrate is an extreme ultraviolet (EUV) mask.

19. The method of claim 14, wherein the first precursor gas is different than the second precursor gas.

20. The method of claim 1, further comprising identifying a defect in a material layer positioned under the surface, and wherein the first material on the surface is positioned directly over the defect.

* * * * *